United States Patent
Su

(10) Patent No.: US 8,015,852 B2
(45) Date of Patent: Sep. 13, 2011

(54) METALLIC COVER AND METHOD FOR MAKING THE SAME

(75) Inventor: Bao-Ping Su, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 775 days.

(21) Appl. No.: 12/012,298

(22) Filed: Feb. 1, 2008

(65) Prior Publication Data
US 2009/0126450 A1 May 21, 2009

(30) Foreign Application Priority Data
Nov. 16, 2007 (CN) .......................... 2007 1 0202573

(51) Int. Cl.
*B21D 22/00* (2006.01)
*B21D 22/21* (2006.01)
(52) U.S. Cl. .......................................... 72/348; 72/356
(58) Field of Classification Search ............ 72/347–348, 72/356, 340, 370.03, 404, 405.01, 392, 384, 72/353.2, 379.2, 386; 413/8
See application file for complete search history.

(56) References Cited

U.S. PATENT DOCUMENTS

| | | | | |
|---|---|---|---|---|
| 4,818,210 A | * | 4/1989 | Van Dijk et al. | 72/466.9 |
| 6,167,742 B1 | * | 1/2001 | Marin | 72/348 |
| 7,052,778 B2 | * | 5/2006 | Sorgi | 428/600 |
| 2004/0244459 A1 | * | 12/2004 | Shiokawa | 72/356 |

FOREIGN PATENT DOCUMENTS
CN 1854440 A 11/2006
* cited by examiner

*Primary Examiner* — Edward Tolan
*Assistant Examiner* — Mohammad I Yusuf
(74) *Attorney, Agent, or Firm* — Altis Law Group, Inc.

(57) ABSTRACT

An exemplary metallic cover (20) includes a bottom base (21) and a side wall (22) extending from the bottom base. The side wall is formed by cold forging so that a thickness of the side wall is greater than that of the bottom base. A method for making the metallic cover described above, includes: drawing a metallic sheet into a preformed cover (30) having a bottom base (31) and a number of side walls (32); forging the preformed cover by a first forming die (200) to thicken the side walls; forging the preformed cover by a second forming die (300) to further thicken the side walls; and machining an end of each of the side walls of the preformed metallic cover to form the metallic cover.

11 Claims, 15 Drawing Sheets

METALLIC COVER AND METHOD FOR MAKING THE SAME

BACKGROUND OF THE INVENTION

1. Field of the Invention

The present invention generally relates to metallic covers, and more particularly to a metallic cover used for electronic devices and a method for making the metallic cover.

2. Discussion of the Related Art

Generally, a metallic cover has a more appealing appearance and a better surface feel than a plastic cover, thus metallic covers are popularly used for electronic devices such as mobile phones.

Referring to FIG. 14, a typical metallic cover 10 is shown. The metallic cover 10 includes a rectangular bottom base 11, a first side wall 12, a second side wall 13, a third side wall 14, and a fourth side wall 15. The side walls 12, 13, 14, 15 perpendicularly extend from a periphery of the rectangular bottom base 11. Each of the side walls 12, 13, 14, 15 connects to its adjacent side walls, thus the side walls 12, 13, 14, 15 cooperatively define a cavity (not labeled) for receiving electronic components (not shown).

Each of the side walls 12, 13, 14, 15 and the bottom base 11 are connected at an edge (not labeled). The edge is generally a rounded edge so that the metallic cover 10 can easily be made by metal drawing method.

However, in order to obtain a different appearance, an edge of another typical cover for connecting the side walls and the bottom base may be a beveled edge instead of the rounded edge. Generally, it is practically impossible to produce the beveled edge using the metal drawing method. A typical method for making a metallic cover with a beveled edge includes two following steps: drawing a metal sheet into a preformed cover; pressing the preformed cover into a metallic cover with a beveled edge by a forming die. However, the edges of the metallic cover are prone to cracks, when using the above method, thus decreasing quality of the metallic covers.

In addition, in order to reduce the volume, size or weight of these electronic devices such as mobile phones, the described metallic covers are generally made by thin metal sheet. However, a thickness of the side walls of the metallic covers is the same as that of the bottom base of the metallic covers. As a result, the strength of the side walls of the metallic covers is relatively low. To enhance the strength of the side walls of a metallic cover, a thickness of each side wall of the metallic cover should be greater than that of the bottom base of the metallic cover. It is also practically impossible to produce an unequal-thickness metallic cover using the metal drawing method. The unequal-thickness metallic cover is generally made by a die-casting method. However, the appearance of the unequal-thickness metallic cover made by the die-casting method is not good, thus the unequal-thickness metallic cover needs to be polished to improve the quality of the appearance of the unequal-thickness metallic cover.

At present, unequal-thickness metallic covers can also be manufactured by computerized numerical control (CNC) milling machines. A first typical method for making an unequal-thickness metallic cover will now be described. A relatively thick raw metallic block is provided. The raw metallic block has to go through several milling processes so as to get a preformed body. The preformed body is made into a metallic cover by a process of finish machining. The above method for making unequal-thickness metallic covers takes a great deal of time, for example, it needs more than ten hours for a process to make one unequal-thickness metallic cover of a mobile phone. Because the unequal-thickness metallic cover goes through several milling processes, the efficiency of the described method is low, thereby increasing the cost of the unequal-thickness metallic covers.

Referring to FIG. 15, a metallic cover made of aluminum alloy, e.g., an aluminum alloy of grade AL5052 using the above milling method shows a metallographic photograph of a portion of the side walls of the metallic cover under 23±5 Celsius degrees (° C.) and 40-80% relative humidity (RH) conditions. The internal structure of the metallic cover is magnified by 200×. The metallographic structure of the metallic cover is relatively incompact. A Vickers hardness of the metallic cover under 23±5° C., 40-80% RH and 0.5 kilograms (kgs) is in a range from 68 to 70.

Therefore, a new metallic cover is desired in order to overcome the above described shortcomings. A new method having high efficiency for making such metallic cover is also needed.

SUMMARY

In one aspect, a metallic cover includes a bottom base and a side wall extending from the bottom base. The side wall is formed by cold forging so that a thickness of the side wall is greater than that of the bottom base.

In another aspect, a method for making the metallic cover described above, includes: drawing a metallic sheet into a preformed cover having a bottom base and a plurality of side walls, and the bottom base and each of the sidewalls connected at a rounded edge; forging the preformed cover by a first forming die to thicken the side walls, and a first slanted pressing surface formed on an end of each of the side walls; forging the preformed cover by a second forming die to further thicken the side walls, and a second slanted pressing surface intersecting with the first slanted pressing surface formed on the end of each of the side walls, and the rounded edge of the preformed cover pressed into a beveled edge; and machining the end of each of the side walls of the preformed metallic cover so that the preformed metallic cover is made into the metallic cover.

Other novel features and advantages will become more apparent from the following detailed description, when taken in conjunction with the accompanying drawings.

BRIEF DESCRIPTION OF THE DRAWINGS

The components in the drawings are not necessarily drawn to scale, the emphasis instead being placed upon clearly illustrating principles of the present metallic cover and method for making the same. Moreover, in the drawings, like reference numerals designate corresponding parts throughout several views, and all the views are schematic.

DETAILED DESCRIPTION OF THE EMBODIMENTS

Reference will now be made to the drawings to describe preferred embodiments of the present metallic cover and method in detail.

Figure 1:
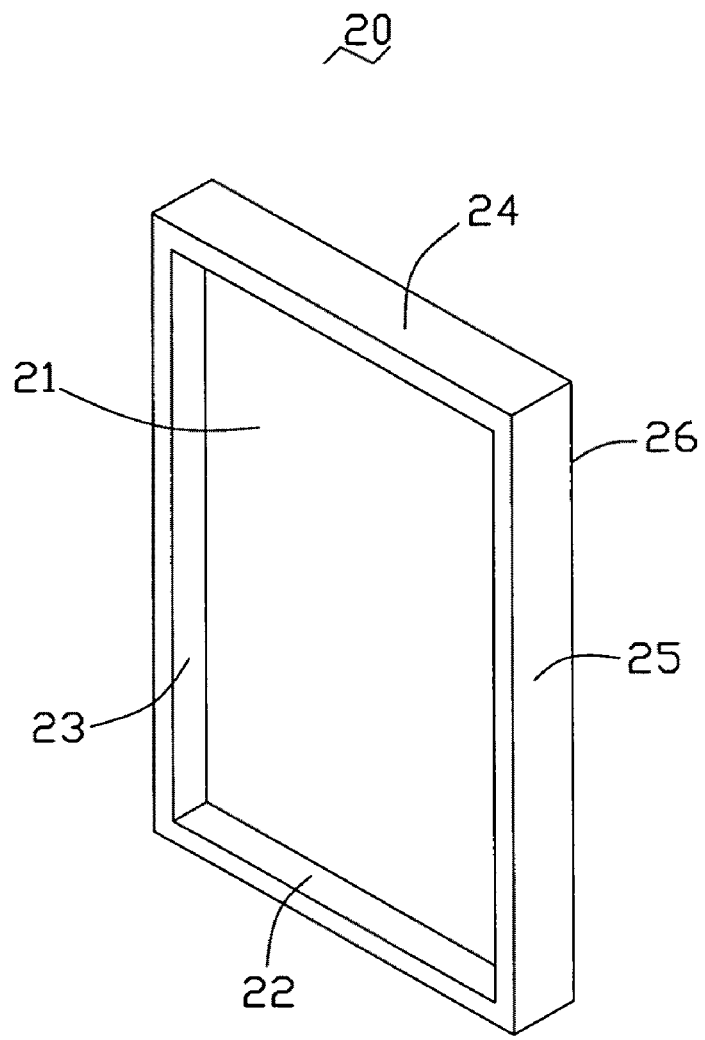
FIG. 1 is an isometric view of a metallic cover in accordance with a preferred embodiment of the present invention.
Figure 2:
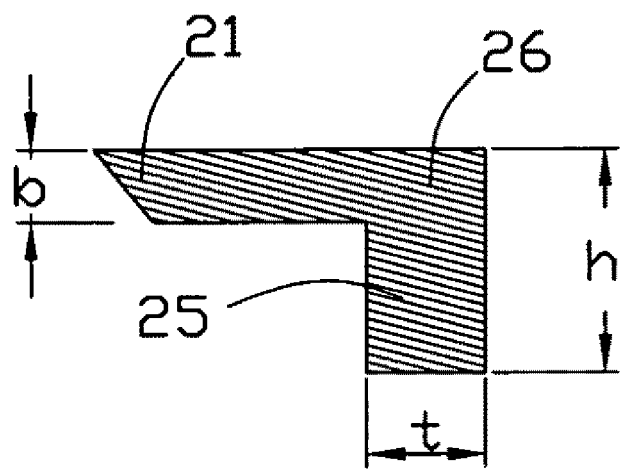
FIG. 2 is a partial, cross-sectional view of an edge of the metallic cover of FIG. 1.

Referring to FIGS. 1 and 2, a metallic cover 20 according to a preferred embodiment is shown. In the illustrated embodiment, the metallic cover 20 is used as a cover for a mobile phone. The metallic cover 20 includes a rectangular bottom base 21, a first side wall 22, a second side wall 23, a third side wall 24, and a fourth side wall 25. The side walls 22, 23, 24, 25 perpendicularly extend from a periphery of the rectangular bottom base 21. The side walls 22, 23, 24, 25 cooperatively define a cavity (not labeled). The bottom base 21 and each of the side walls 22, 23, 24, 25 are correspondingly connected at an edge 26. The side walls 22, 23, 24, 25 of the metallic cover 20 are formed by cold forging, thus a thickness of each of the side walls 22, 23, 24, 25 of the metallic cover 20 is greater than that of the bottom base 21 of the metallic cover 20.

In the described embodiment, b represents a thickness of the bottom base 21, t represents a thickness of each of the side walls 22, 23, 24, 25, and h represents a height of each of the side walls 22, 23, 24, 25. The ratio between t and b (t/b) is preferably in a range from about 1 to about 3, and the ratio between h and b (h/b) is preferably in a range from about 1 to about 2.5. The metallic cover 20 is preferably made of aluminum alloy. The edge 26 is a beveled edge formed by cold forging. The angle formed between an outer surface of the bottom base 21 and an outer surface of each of the sidewalls 22, 23, 24, 25 at the edge 26 is in a range from about 90 degrees to about 135 degrees.

It should be pointed out that, the bottom base 21 can also be other shapes such as triangular, pentagonal, and hexagonal. The edge 26 is not limited to a beveled edge, the edge can also be other shapes, that is, not beveled, formed by cold forging.

Figure 3:
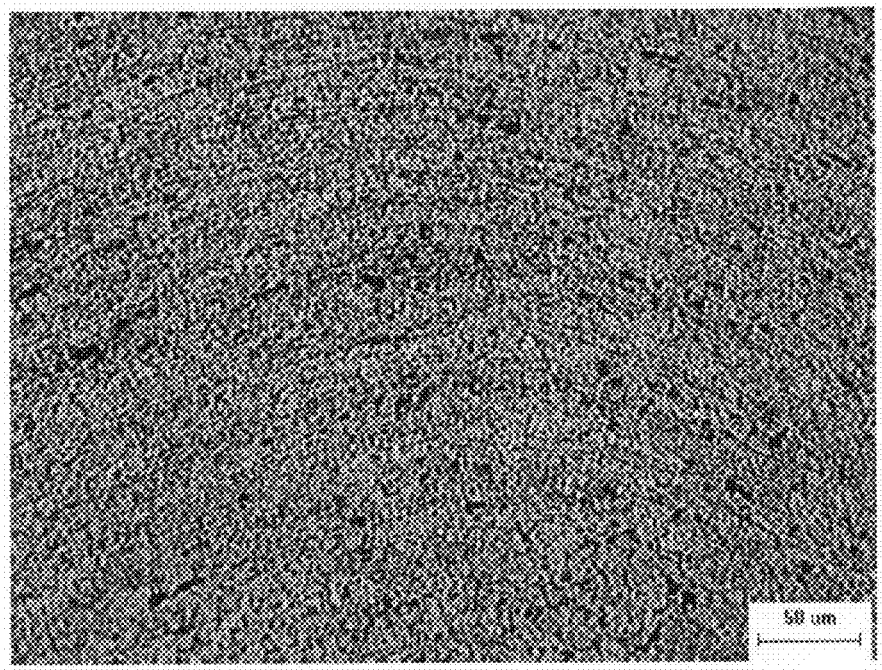
FIG. 3 is a metallographic photograph of part of the edge of the metallic cover magnified by 200×.
Figure 4:
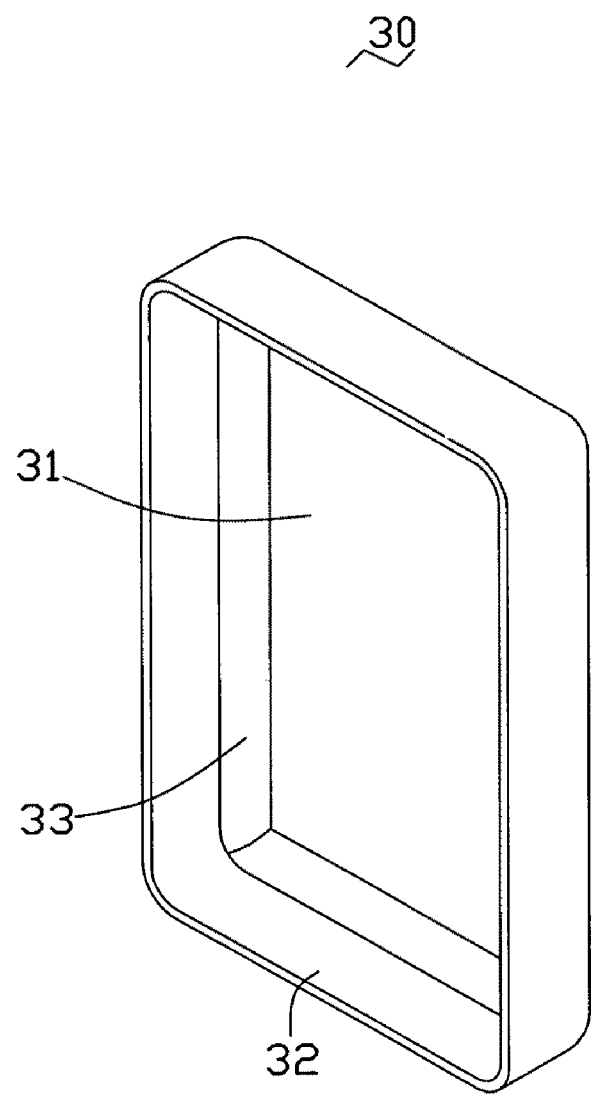
FIG. 4 is an isometric view of a preformed metallic cover formed in a method for making the metallic cover of FIG. 1.
Figure 5:
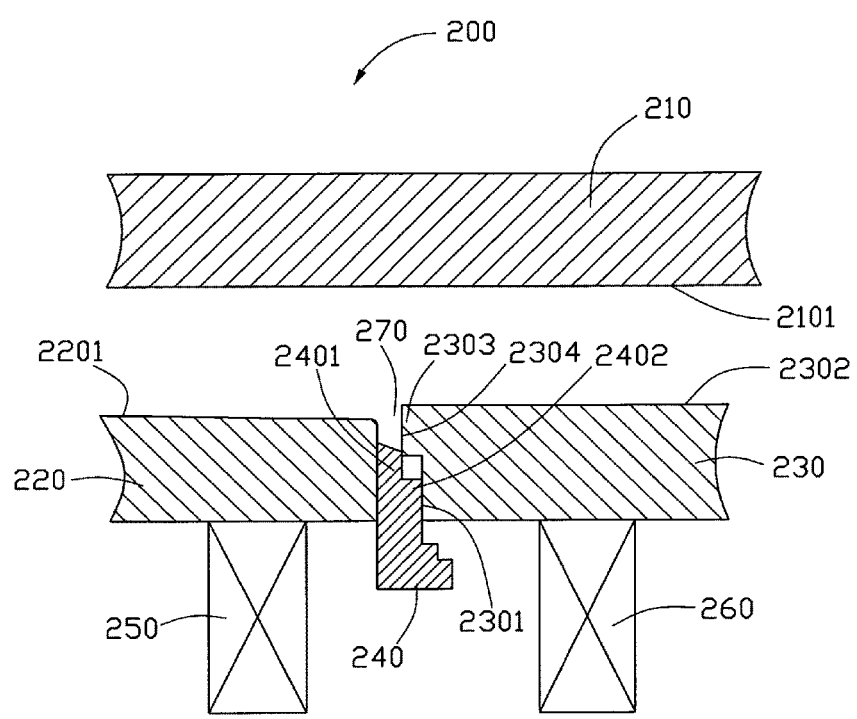
FIG. 5 is a cross-sectional view of a first forming die used for pressing the preformed metallic cover of FIG. 4.
Figure 6:
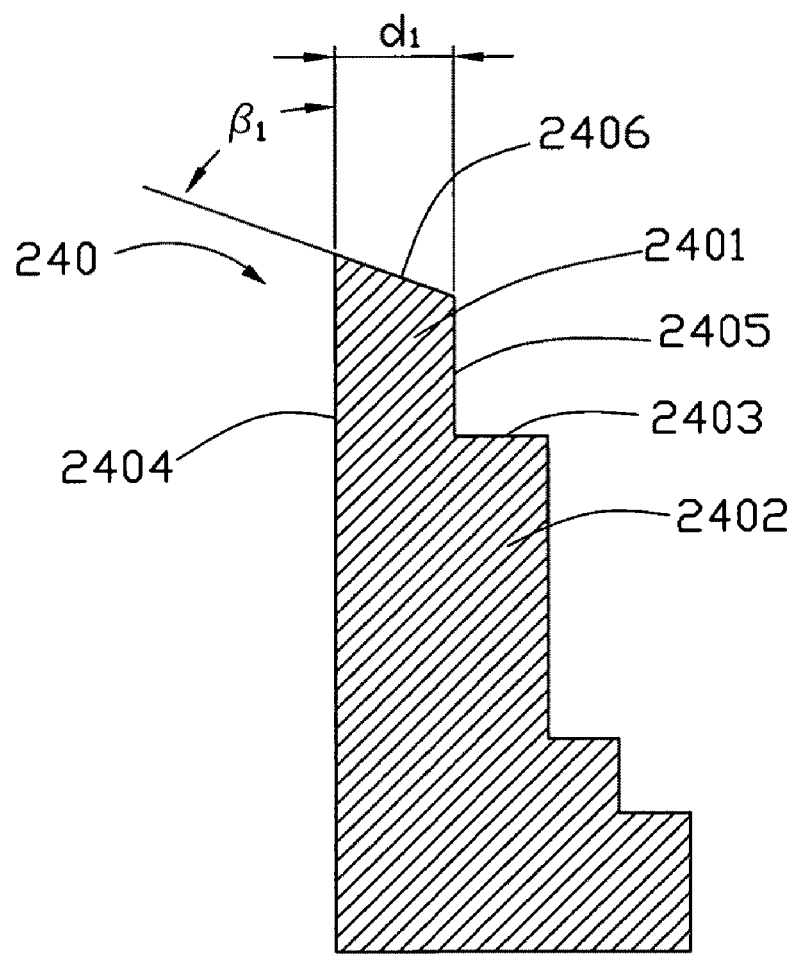
FIG. 6 is an enlarged, side cross-sectional view of a punch of the first forming die of FIG. 5.
Figure 7:
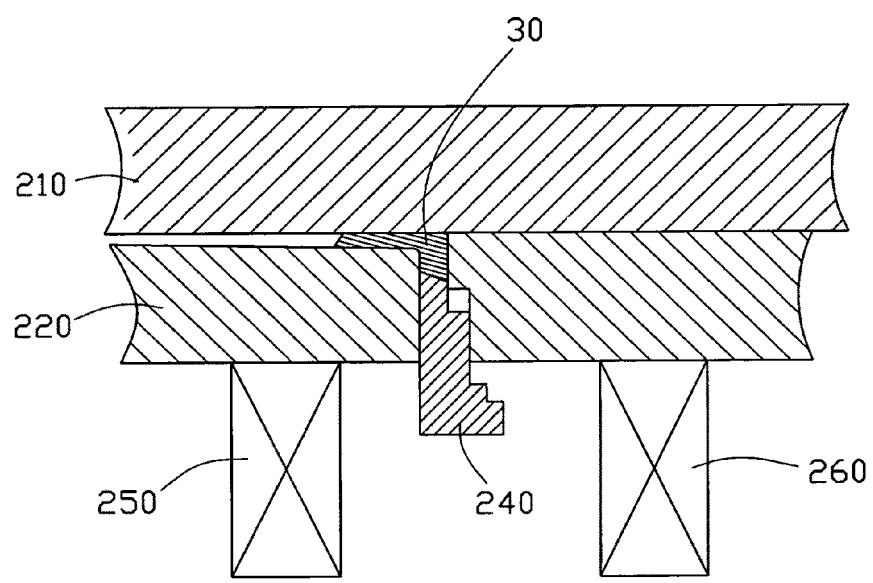
FIG. 7 is a partial, cross-sectional view of the first forming die which is pressing the preformed metallic cover of FIG. 4.
Figure 8:
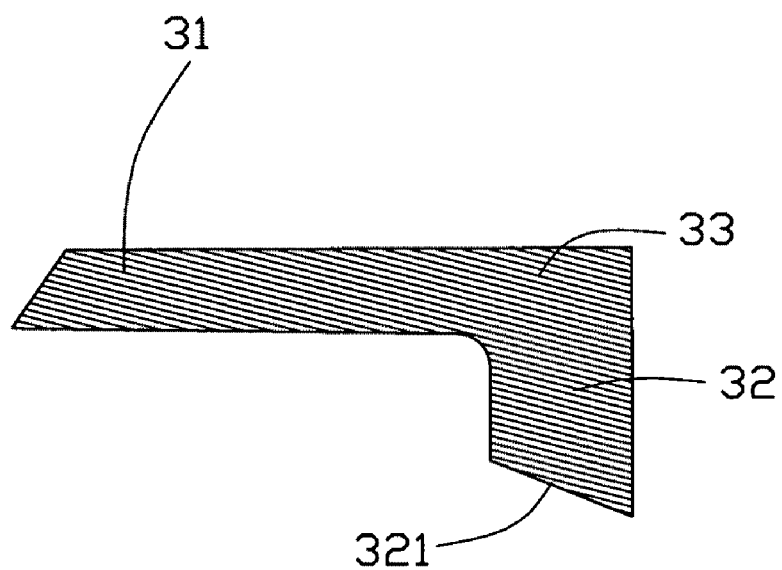
FIG. 8 is a partial, cross-sectional view of the preformed metallic cover after being pressed by the first forming die of FIG. 5.
Figure 9:
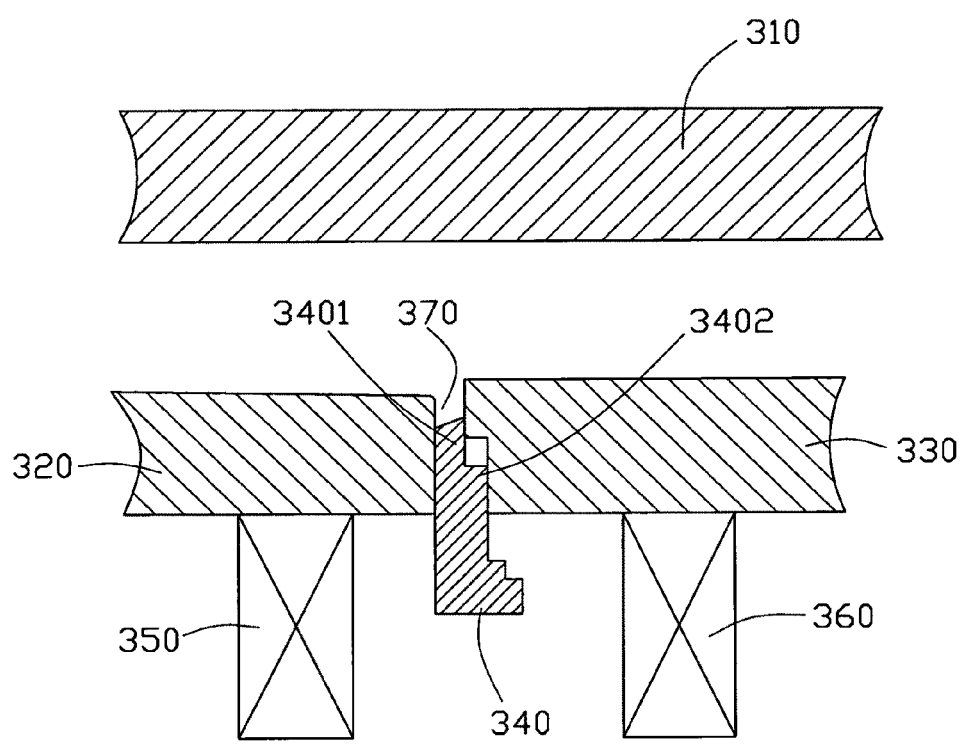
FIG. 9 is a cross-sectional view of a second forming die used for further pressing the preformed metallic cover which has been pressed by the first forming die of FIG. 5.
Figure 10:
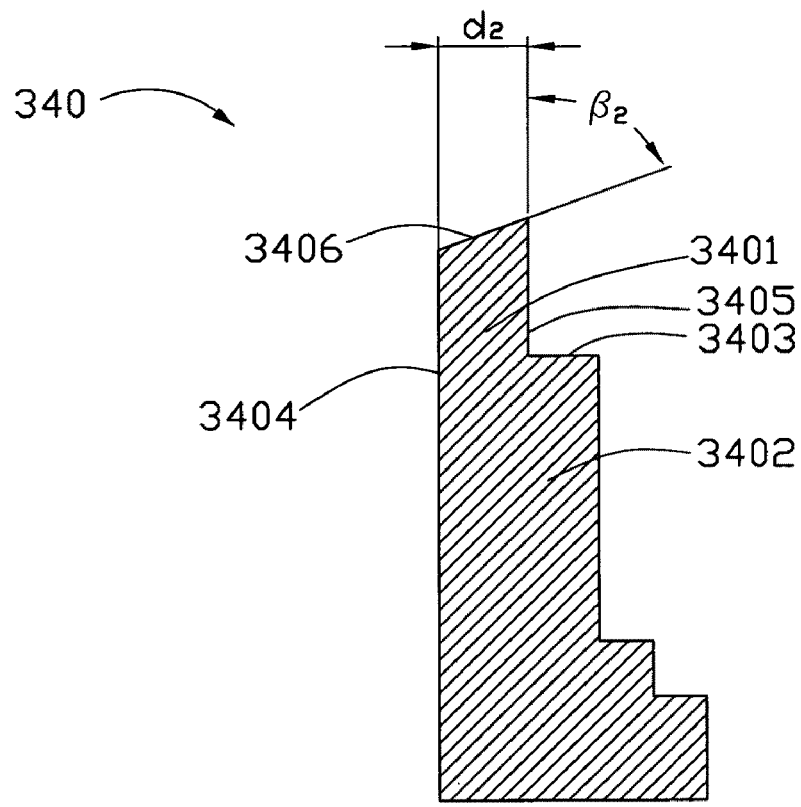
FIG. 10 is an enlarged, side cross-sectional view of a punch of the second forming die of FIG. 9.
Figure 11:
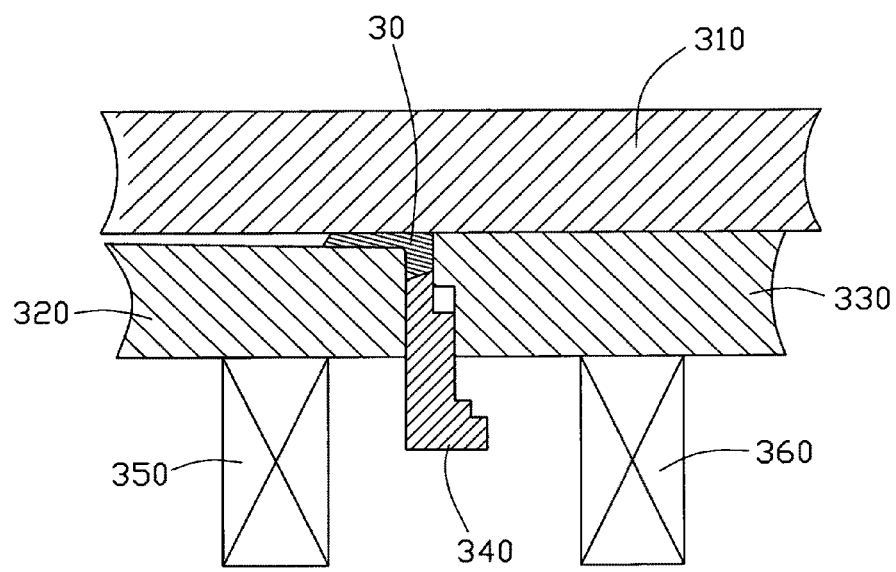
FIG. 11 is a partial, cross-sectional view of the second forming die which is pressing the preformed metallic cover which has been pressed by the first forming die.
Figure 12:
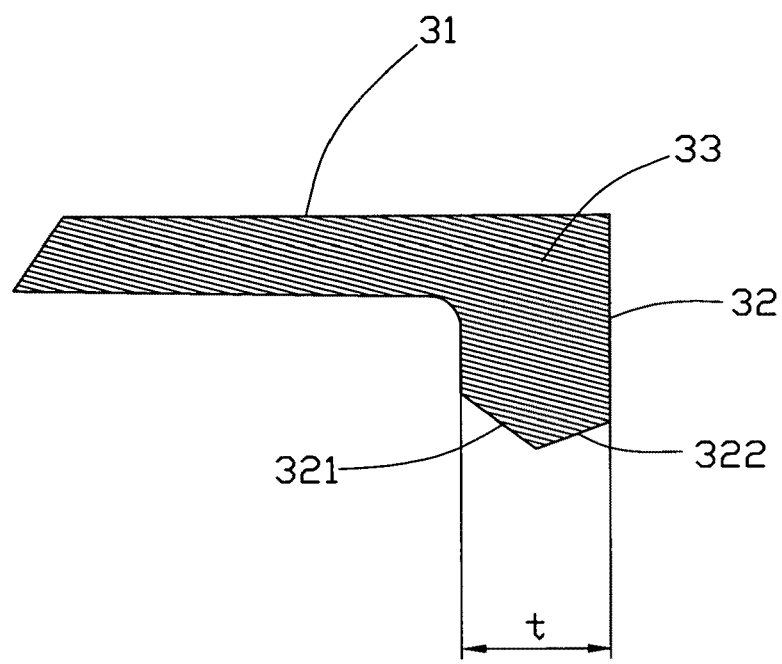
FIG. 12 is a partial, cross-sectional view of the preformed metallic cover after being pressed by the second forming die of FIG. 9.

Referring to FIG. 3, the metallic cover 20 made of aluminum alloy, e.g., an aluminum alloy of grade 5052-O using cold forging method shows a metallographic photograph of a portion of the metallic cover under 23±5° C. and 40-80% relative humidity (RH) conditions. The metallographic photograph of the metallic cover is magnified by 200×. The metallographic structure of the metallic cover is relatively compact. A Vickers hardness of the metallic cover 20 under 23±5° C., 40-80% RH and 0.5 kilograms (kgs) is in a range from 71 to 75. Therefore, the Vickers hardness of the metallic cover 20 formed by cold forging is greater than the Vickers hardness of a metallic cover which is formed by milling method.

Referring to FIGS. 4 through 13, an exemplary method for making the metallic cover 20 will now be described. The method for making the metallic cover includes the following main steps: a drawing process; a first cold forging process; a second cold forging process; and a finish machining process.

In the drawing process, a metallic sheet is drawn into a preformed metallic cover 30. In the illustrated embodiment, the metallic sheet used for making the preformed metallic cover 30 is preferably made of aluminum alloys such as 5052-O aluminum alloy. The preformed cover 30 includes a bottom base 31 and a plurality of side walls 32. The side walls 32 cooperatively define a cavity (not labeled) for receiving electronic components (not shown). The bottom base 31 and each of the sidewalls 32 are connected at a rounded edge 33.

In the first cold forging process, the preformed cover 30 is forged by a first forming die 200 to flatten the side walls 32, thereby thickening (widening) the side walls 32, and to form a first slanted pressed surface 321 (see FIG. 8) on an end of each of the side walls 32.

Referring to FIGS. 5 through 8, the first forming die 200 includes an upper die 210, a lower die 220, a pressing member 230, a punch 240, a first resilient member 250, and a second resilient member 260. The lower die 220 and the pressing member 230 are disposed adjacent to and on opposite sides of the punch 240 correspondingly. The punch 240, the lower die 220, and the pressing member 230 cooperatively define a molding groove 270 for receiving the side walls 32 of the preformed metallic cover 30. A thickness of the molding groove 270 is greater than that of each of the side walls 32 of the preformed metallic cover 30. The upper die 210 is disposed above the lower die 220, the pressing member 230, and the punch 240. The first resilient member 250 and the second resilient member 260 are both springs. The first resilient member 250 is disposed below the lower die 220. The second resilient member 260 is disposed below the pressing member 230. The upper die 210 includes a working surface 2101 formed on a bottom surface for pressing the bottom base 31 of the preformed metallic cover 30. The lower die 220 includes a mounting surface 2201 formed on a top surface for mounting the preformed metallic cover 30. The pressing member 230 includes a side surface 2301 and an upper surface 2302 perpendicular to each other. An extending portion 2303 is formed on the side surface 2301 adjacent to the upper surface 2302. The extending portion 2303 includes a pressing surface 2304 for pushing against the side walls 32 of the preformed cover 30. The pressing surface 2304 is perpendicular to the working surface of the upper die 220, and is parallel to the side surface 2301.

The punch 240 includes a punching portion 2401 and a restricting portion 2402 that connects to the punching portion 2401. The punching portion 2401 includes a first side surface 2404, a second side surface 2405, and a slanted working surface 2406. The first side surface 2404 is parallel to the second side surface 2405, and the first side surface 2404 and the second side surface 2405 are on opposite sides of the punching portion 2401 correspondingly. $d_1$ represents a distance between the first side surface 2404 and the second side surface 2405, and t represents the final thickness of the sidewall of the metallic cover. The distance $d_1$ should be in a range from 0.7t to 0.9t. The distance $d_1$ is preferably in a range from 0.8t to 0.85t. An edge of the slanted working surface 2406 connects the first side surface 2404 and an opposite edge of the slanted working surface 2406 connects the second side surface 2405. The edge of the slanted working surface 2406 adjacent to the first side surface 2404 is configured to be higher than the opposite edge of the slanted working surface 2406 adjacent to the second side surface 2405. In other words, the slanted working surface 2406 slants towards the first side surface 2404. An angle $\beta_1$ defined by the slanted working surface 2406 relative to the first side surface 2404 should be in a range from about 45 degrees to about 70 degrees. The angle $\beta_1$ is preferably in a range from about 60 degrees to about 65 degrees. The restricting portion 2402 includes a positioning surface 2403 for restricting the motion range of the pressing member 230.

Before the first cold forging process, a distance between the upper surface 2302 of the pressing member 230 and the mounting surface 2201 of the lower die 220 is greater than the thickness of the bottom base 31 of the preformed metallic cover 30. The pressing surface 2304 of the extending portion 2303 of the pressing member 230 abuts the second side surface 2405 of the punching portion 2401 of the punch 240. The side surface 2301 of the pressing member 230 abuts the restricting portion 2402 of the punch 240. A lower end of the extending portion 2303 of the pressing member 230 is set a predetermined distance away from the positioning surface 2403 of the restricting portion 2402 of the punch 240. The preformed metallic cover 30 is placed on the lower die 220 and the side walls 32 of the preformed metallic cover are received in the molding groove 270.

During the first cold forging process, the upper surface 2302 of the pressing member 230 and the bottom base 31 of the preformed metallic cover 30 are pressed by the upper die 210. When the lower die 220 and the pressing member 230 are pressed, the first resilient member 250 and the second resilient member 260 becomes compressed. When the lower die 220 and the pressing member 230 are pressed, the side walls 32 of the preformed metallic cover 30 received in the molding groove 270 presses/pushes against the slanted working surface 2406 of the punch 240; material of the side walls 32 displaces (molds) into the molding groove 270. When the pressing member 230 is pressed until the extending portion 2303 of the pressing member 230 abuts the positioning surface 2403 of the restricting portion 2402 of the punch 240, the lower die 220 and the pressing member 230 stop moving. In the first cold forging process, material of the side walls 32 of the preformed metallic cover 30 flattens out into the molding groove 270, thus the side walls 32 of the preformed metallic cover 30 become thicker (wider) than the bottom base 31. The rounded edge 33 of the preformed cover 30 is pressed into a substantially beveled edge.

In the second cold forging process, the preformed cover 30 is forged by a second forming die 300 to flatten the side walls 32, thereby further thickening (widening) the side walls 32, and to form a second slanted pressing surface 322 intersecting with the first slanted pressing surface 321 on the end of each of the side walls 32. The rounded edge 33 of the preformed cover 30 is pressed into the beveled edge 26.

Referring to FIGS. 9 through 12, the second forming die 300 includes an upper die 310, a lower die 320, a pressing member 330, a punch 340, a first resilient member 350, and a second resilient member 360. The principle of the second forming die 300 is similar to the first forming die 200. However, the punch 340 is different from the punch 240 of the first forming die 200. The punch 340 will now be described in detail as follows.

The punch 340 includes a punching portion 3401 and a restricting portion 3402 connecting to the punching portion 3401. The punching portion 3401 includes a first side surface 3404, a second side surface 3405, and a slanted working surface 3406. The first side surface 3404 is parallel to the second side surface 3405, first side surface 3404 and the second side surface 3405 are on opposite sides of the punching portion 3401 correspondingly. A distance $d_2$ between the first side surface 3404 and the second side surface 3405 equals to the thickness t of the sidewall of the metallic cover to be formed. An edge of the slanted working surface 3406 connects the first side surface 3404 and an opposite edge of the slanted working surface 3406 connects the second side surface 3405. The opposite edge of the slanted working surface 3406 adjacent to the second side surface 3405 is configured to be higher than the edge of the slanted working surface 3406 adjacent to the first side surface 3404. An angle $\beta_2$ defined by the slanted working surface 3406 relative to the first side surface 3404 should be in a range from about 45 degrees to about 70 degrees. The angle $\beta_2$ is preferably in a range from about 60 degrees to about 65 degrees. The restricting portion 3402 includes a positioning surface 3403 for restricting the motion range of the pressing member 330. The punch 340, the lower die 320, and the pressing member 330 cooperatively define a molding groove 370 for receiving the side walls 32 of the preformed metallic cover 30. A thickness of the molding groove 370 is greater than the thickness of the side walls 32 of the preformed metallic cover 30.

In the second cold forging process, the pressing member 330 and the bottom base 31 of the preformed metallic cover 30 is pressed by the upper die 310. When the lower die 320 and the pressing member 330 are pressed, the side walls 32 of the preformed metallic cover 30 received in the molding groove 370 presses/pushes against the slanted working surface 3406 of the punch 340; material of the side walls 32 displaces (molds) into the molding groove 370. When the extending portion 3303 of the pressing member 230 abuts the positioning surface 3403 of the restricting portion 3402 of the punch 340, the lower die 320 and the pressing member 330 stop moving. In the second cold forging process, material of the side walls 32 of the preformed metallic cover 30 flattens out into the molding groove 370, thus the side walls 32 of the preformed metallic cover 30 become thicker than the bottom base 31 and the rounded edge 33 of the preformed cover 30 is pressed into beveled edge.

In the finish machining process, each of the side walls 32 of the preformed metallic cover 30 is machined to a predetermined shape by a machining tool such as a milling machine, and thereby forming the metallic cover 20. In the described embodiment, the first slanted pressing surface 321 and the second slanted pressing surface 322 of each of the side walls 32 are cut off and a flat surface is formed on the side walls 32.

Figure 13:
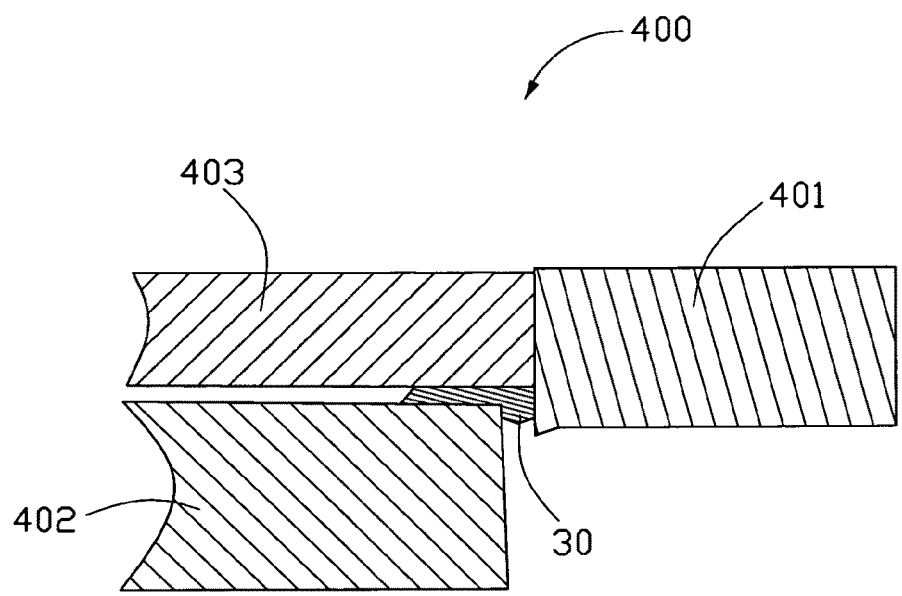
FIG. 13 is a partial, cross-sectional view of a third finish machining die for making the preformed metallic cover which pressed by the second forming die of FIG. 9 into the metallic cover of FIG. 1.
Figure 14:
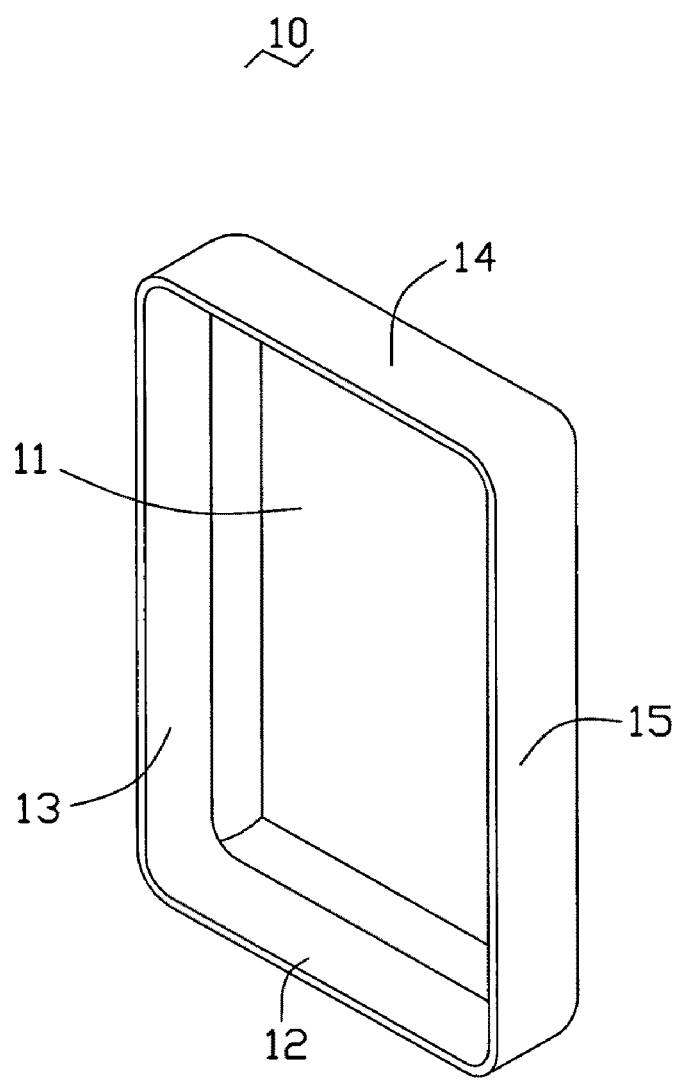
FIG. 14 is an isometric view of a conventional metallic cover.
Figure 15:
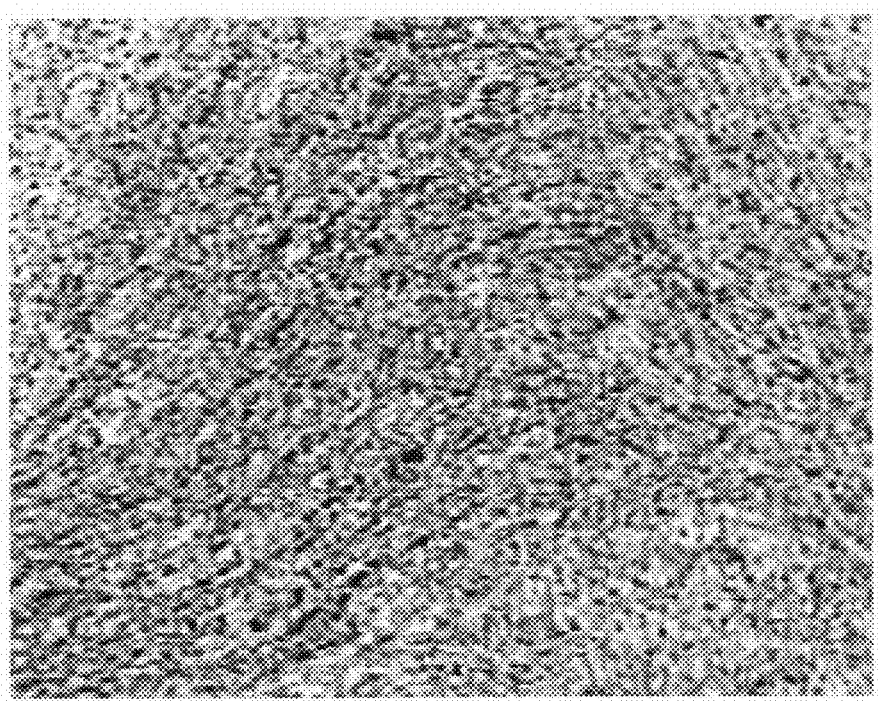
FIG. 15 is a metallographic photograph of part of the conventional metallic cover magnified by 200×.

In an alternative embodiment, referring to FIG. 13, in order to further improving the surface appearance of the preformed metallic cover 30, a precision machining process is applied between the second cold forging process and the finish machining process. In the precision machining process, the sidewalls 32 of the preformed metallic cover 30 are processed by a precision forming die 400. The precision forming die 400 includes an upper die 401, a lower die 402, and a pressing plate 403. In use, the preformed metallic cover 30 is fixed on the lower die 402 by the pressing plate 403, and the side walls of the preformed metallic cover 30 extend out of the lower die 402. When the upper die 401 moves towards the lower die 402, a part of the side walls 32 of the preformed metallic cover 30 is cut off, thus the surface appearance the side walls 32 is improved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for making a metallic cover, comprising:
   drawing a metallic sheet into a preformed cover having a bottom base and a plurality of side walls, and the bottom base and each of the sidewalls connected at a rounded edge;
   forging the preformed cover by a first forming die to thicken the side walls, the first forming die comprising a punch having a slanted working surface to form a first slanted pressing surface on a distal end of each of the side walls;
   forging the preformed cover by a second forming die to further thicken the side walls, the second forming die comprising a punch having a slanted working surface to form a second slanted pressing surface intersecting with the first slanted pressing surface on the distal end of each of the side walls, and the rounded edge of the preformed cover pressed into a beveled edge; and
   machining the end of each of the side walls of the preformed metallic cover to form the metallic cover.

2. The method as claimed in claim 1, wherein the first forming die comprises an upper die, a lower die, a pressing member, a punch, a first resilient member, and a second resilient member; the lower die and the pressing member are disposed adjacent to and on opposite sides of the punch correspondingly; the upper die is disposed above the lower die, the pressing member, and the punch; and the first resilient member is disposed below the lower die, the second resilient member is disposed below the pressing member.

3. The method as claimed in claim 2, wherein the first resilient member and the second resilient member are both compression spring; the punch, the lower die, and the pressing member cooperatively define a molding groove for receiving the side walls of the preformed metallic cover; and a thickness of the molding groove is greater than the thickness of each of the side walls of the preformed metallic cover.

4. The method as claimed in claim 2, wherein the upper die comprises a working surface formed on a bottom surface thereof for pressing the bottom base of the preformed metallic cover; the lower die comprises a mounting surface formed on a top surface thereof for mounting the preformed metallic cover; and the pressing member comprises a side surface and an upper surface perpendicular to the side surface; and an extending portion is formed on the side surface and is adjacent to the upper surface, the extending portion comprises a pressing surface for pressing the side walls of the preformed cover, and the pressing surface is perpendicular to the working surface of the upper die and parallel to the side surface.

5. The method as claimed in claim 2, wherein the punch of the first forming die comprises a punching portion having a first side surface, and a second side surface, the slanted working surface of the first forming die is formed at a distal end of the punch; the first side surface is parallel to the second side surface, and the first side surface and the second side surface are on opposite sides of the punching portion correspondingly; a ratio of a distance between the first side surface and the second side surface with respect to a thickness of sidewalls of the metallic cover is in a range from 0.7 to 0.9; and the slanted working surface slants towards the first side surface, and an angle defined by the slanted working surface and the first side surface is in a range from 45 degrees to 70 degrees.

6. The method as claimed in claim 1, wherein the second forming die comprises an upper die, a lower die, a pressing member, a punch, a first resilient member, and a second resilient member; the lower die and the pressing member are disposed adjacent to and on opposite sides of the punch correspondingly; the upper die is disposed above the lower die, the pressing member, and the punch; and the first resilient member is disposed below the lower die, the second resilient member is disposed below the pressing member.

7. The method as claimed in claim 6, wherein the first resilient member and the second resilient member are both springs; the punch, the lower die, and the pressing member cooperatively define a molding groove for receiving the side walls of the preformed metallic cover; and a thickness of the molding groove is greater than the thickness of the side walls of the preformed metallic cover.

8. The method as claimed in claim 6, wherein the upper die comprises a working surface formed on a bottom surface thereof for pressing the bottom base of the preformed metallic cover; the lower die comprises a mounting surface formed on a top surface thereof for mounting the preformed metallic cover; and the pressing member comprises a side surface and an upper surface perpendicular to the side surface; and an extending portion is formed on the side surface and is adjacent to the upper surface, the extending portion comprises a pressing surface for pressing the side walls of the preformed cover, and the pressing surface is perpendicular to the working surface of the upper die and parallel to the side surface.

9. The method as claimed in claim 6, wherein the punch of the second forming die comprises a punching portion having a first side surface, and a second side surface, the slanted working surface of the second forming die is formed at a distal end of the punch; the first side surface is parallel to the second side surface, and a distance between the first side surface and the second side surface equals to a thickness of the sidewalls of the metallic cover; the slanted working surface slants towards the second side surface, and an angle defined by the slanted working surface and the first side surface is in a range from 45 degrees to 70 degrees.

10. The method as claimed in claim 2, further comprising a precision machining process before machining the end of each of the side walls of the preformed metallic cover, the sidewalls of the preformed metallic cover is processed by a precision forming die.

11. The method as claimed in claim 10, wherein the precision forming die comprises an upper die, a lower die, and a pressing plate; the preformed metallic cover is fixed on the lower die by the pressing plate, the side walls of the preformed metallic cover extend out of the lower die, the upper die moves towards the lower die and a part of the side walls of the preformed metallic cover is cut off.

* * * * *